US010613590B1

(12) United States Patent
Lee et al.

(10) Patent No.: US 10,613,590 B1
(45) Date of Patent: Apr. 7, 2020

(54) NOTEBOOK COMPUTER

(71) Applicants: INVENTEC (PUDONG) TECHNOLOGY CORPORATION, Shanghai (CN); INVENTEC CORPORATION, Taipei (TW)

(72) Inventors: Kuan-Wei Lee, Taipei (TW); Jui Hsiang Chen, Taipei (TW); I-Ko Song, Taipei (TW); Chun-Chi Lin, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/353,967

(22) Filed: Mar. 14, 2019

(30) Foreign Application Priority Data

Nov. 23, 2018 (CN) .......................... 2018 1 1404996

(51) Int. Cl.
*G06F 1/16* (2006.01)
*H05K 5/02* (2006.01)

(52) U.S. Cl.
CPC .......... *G06F 1/1656* (2013.01); *G06F 1/1616* (2013.01); *H05K 5/023* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,351,508 A * | 10/1994 | Kelley | ................ | E05B 73/0005 16/445 |
| 5,437,367 A * | 8/1995 | Martin | ..................... | A45C 5/14 190/107 |
| 5,625,535 A * | 4/1997 | Hulsebosch | .......... | G06F 1/1616 257/659 |
| 6,636,420 B2 * | 10/2003 | Nakano | ................. | G06F 1/1616 248/917 |
| 6,654,235 B2 * | 11/2003 | Imsand | ..................... | G06F 1/16 150/165 |
| 7,366,925 B2 * | 4/2008 | Keely | ................... | G06F 1/1628 361/679.55 |
| 7,869,200 B2 * | 1/2011 | Horie | ........................ | G06F 1/16 361/679.02 |
| 7,898,796 B2 * | 3/2011 | Horie | ........................ | G06F 1/16 361/679.02 |
| 8,081,429 B2 * | 12/2011 | Horie | ........................ | G06F 1/16 361/679.01 |
| 8,174,825 B2 * | 5/2012 | Lee | ...................... | G11B 33/025 361/679.31 |

(Continued)

*Primary Examiner* — Lisa Lea-Edmonds
(74) *Attorney, Agent, or Firm* — Maschoff Brennan

(57) ABSTRACT

This disclosure relates to a notebook computer including a computer host, a display device, a handle, a power cable and a plug. The display device is pivotably disposed on the computer host. The handle is disposed on the computer host. The handle has a recess. The power cable includes a base portion, a distal portion and middle portion. The base portion is connected to the distal portion via the middle portion. The middle portion is connected to the computer host via the base portion. The middle portion is removably located in the recess of the handle. The plug is connected to the distal portion and detachably disposed on the computer host.

9 Claims, 10 Drawing Sheets

(56) References Cited

U.S. PATENT DOCUMENTS

| | | | | |
|---|---|---|---|---|
| 8,576,563 B2* | 11/2013 | Yang | ............... | A63H 33/006 |
| | | | | 206/701 |
| 9,128,673 B2* | 9/2015 | Chiu | ............... | G06F 1/1635 |
| 9,244,489 B2* | 1/2016 | Huang | ............... | G06F 1/1607 |
| 10,139,855 B2* | 11/2018 | Rane | ............... | G06F 1/1628 |
| 2012/0044624 A1* | 2/2012 | Hoffman | ............... | G06F 1/1628 |
| | | | | 361/679.21 |
| 2014/0126230 A1* | 5/2014 | Harris | ............... | A45C 13/30 |
| | | | | 362/382 |

\* cited by examiner

NOTEBOOK COMPUTER

CROSS-REFERENCE TO RELATED APPLICATIONS

This non-provisional application claims priority under 35 U.S.C. § 119(a) on Patent Application No(s). 201811404996.7 filed in China, P.R.C. on Nov. 23, 2018, the entire contents of which are hereby incorporated by reference.

BACKGROUND OF THE INVENTION

Technical Field of the Invention

The present disclosure relates to a notebook computer, more particularly to a notebook computer including a power cable able to be stored on a handle.

Description of the Related Art

Notebook computers can get electricity from an external power source or an inbuilt battery. For those who regularly work on their notebook computers, the battery capacity is not suitable for long-time use. Therefore, the notebook computers are usually connected to the external power source by using a power cable to provide dependable power for operating the notebook computers for long period of time.

SUMMARY OF THE INVENTION

According to one aspect of the present disclosure, a notebook computer includes a computer host, a display device, a handle, a power cable and a plug. The display device is pivotably disposed on the computer host. The handle is disposed on the computer host. The handle has a recess. The power cable includes a base portion, a distal portion and a middle portion. The base portion is connected to the distal portion via the middle portion. The middle portion is connected to the computer host via the base portion. The middle portion is removably located in the recess of the handle. The plug is connected to the distal portion and detachably disposed on the computer host.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
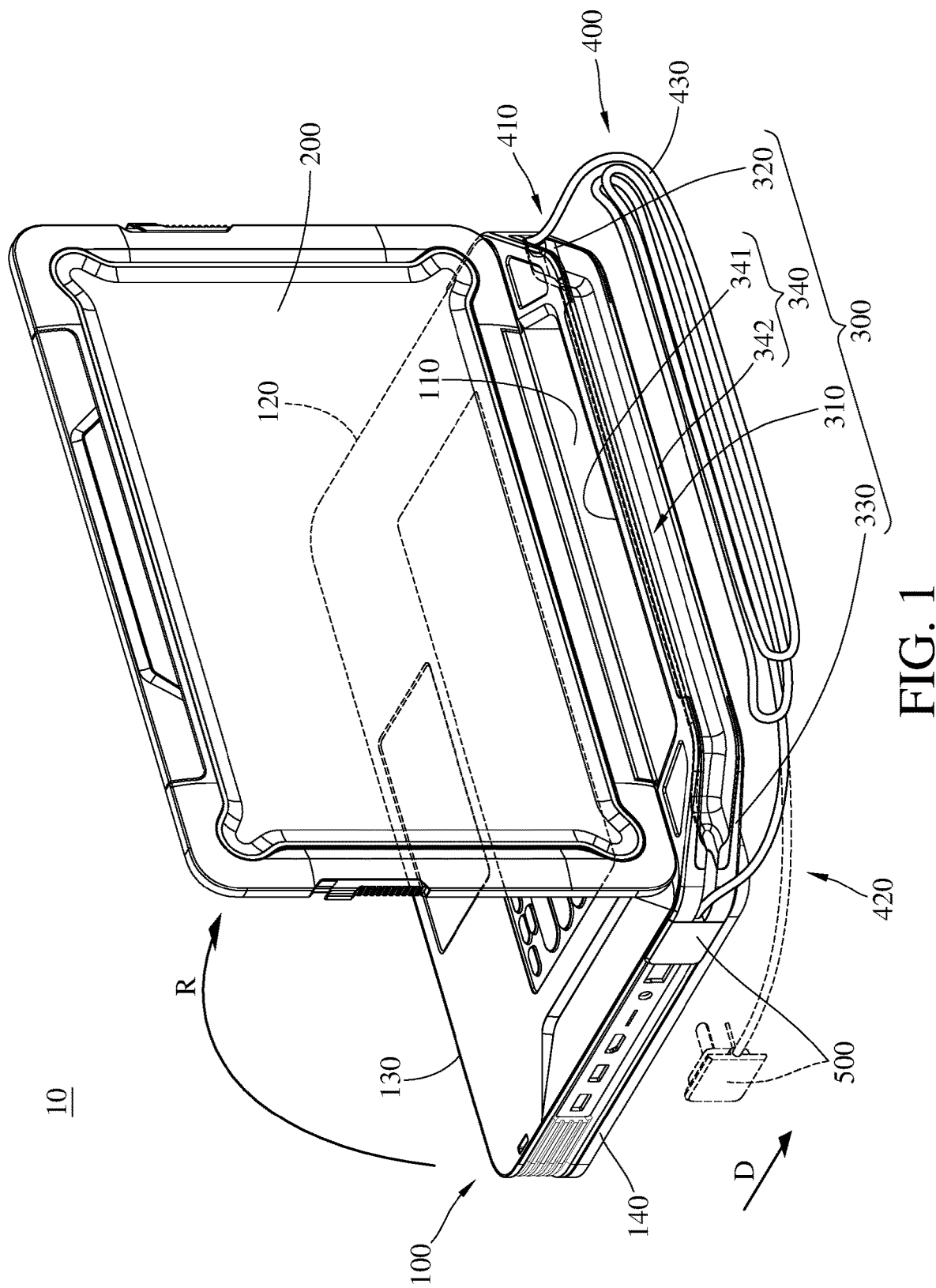
FIG. 1 is a perspective view of a notebook computer according to one embodiment of the present disclosure when a power cable is not stored in a handle.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a perspective view of a notebook computer 10 according to one embodiment of the present disclosure when a power cable 400 is not stored in a handle 300.

This embodiment provides the notebook computer 10 including a computer host 100, a display device 200, the handle 300, the power cable 400, and a plug 500. The notebook computer 10 may be a portable device capable of live streaming. The display device 200 is pivotably disposed on the computer host 100. The handle 300 is disposed on the computer host 100 and has a recess 310. The power cable 400 includes a base portion 410, a distal portion 420, and a middle portion 430. The base portion 410 is connected to the distal portion 420 via the middle portion 430. The middle portion 430 is connected to the computer host 100 via the base portion 410. The middle portion 430 is removably located in the recess 310 of the handle 300. The plug 500 is connected to the distal portion 420 and detachably disposed on the computer host 100. The power cable 400, the plug 500 and the computer host 100 are connected; therefore, they will not be stored separately. As such, the user would not forget to bring the power cable 400 and the plug 500. In addition, the middle portion 430 of the power cable 400 can be stored in the recess 310 of the handle 300, which is convenient for user while carrying the notebook computer 10.

In detail, in this and some embodiments of the present disclosure, the computer host 100 may further include a first side 110, a second side 120, a third side 130, and a fourth side 140. The first side 110 and the third side 130 are located opposite to each other. The second side 120 and the fourth side 140 are located between the first side 110 and the third side 130 and are located opposite to each other. The display device 200 is pivotably disposed at the first side 110 of the computer host 100 along a direction R. The handle 300 may be elastic and may further include a first part 320, a second part 330, and an arm part 340. The first part 320 is disposed at the second side 120 of the computer host 100, and the second part 330 is disposed at the fourth side 140 of the computer host 100. The first part 320 and the second part 330 extend away from the first side 110 of the computer host 100 along a direction D, and the first part 320 is connected to the second part 330 via the arm part 340. The arm part 340 is sized to be hand-held, and the user is allowed to carry the notebook computer 10 by holding the arm part 340.

In this and some embodiments of the present disclosure, the arm part 340 may further have an inner surface 341 and an outer surface 342. The inner surface 341 faces the first side 110 of the computer host 100. The outer surface 342 is located farther away from the first side 110 of the computer host 100 than the inner surface 341. The recess 310 of the handle 300 is formed on the outer surface 342 of the arm part 340, the first part 320, and the second part 330. The base portion 410 of the power cable 400 is movably connected to the second side 120 of the computer host 100. The distal portion 420 of the power cable 400 is removably located at the fourth side 140 of the computer host 100. The plug 500 is detachably stored in the fourth side 140 of the computer host 100. The fourth side 140 may have a socket (not shown in the drawings) for the insertion of the plug 500. As such, the power cable 400 and the plug 500 can be respectively stored in the recess 310 of the handle 300 and the fourth side 140 of the computer host 100 so that the power cable 400 and the plug 500 are assembled to the handle 300 and the computer host 100, thereby achieving an aesthetic appearance of the notebook computer 10. The power cable 400 is able to be taken out of the recess 310 of the handle 300, and the plug 500 is able to be detached from the fourth side 140 of the computer host 100; and the computer host 100 is able to be electrically connected to an external power source via the power cable 400 and the plug 500.

Figure 2:
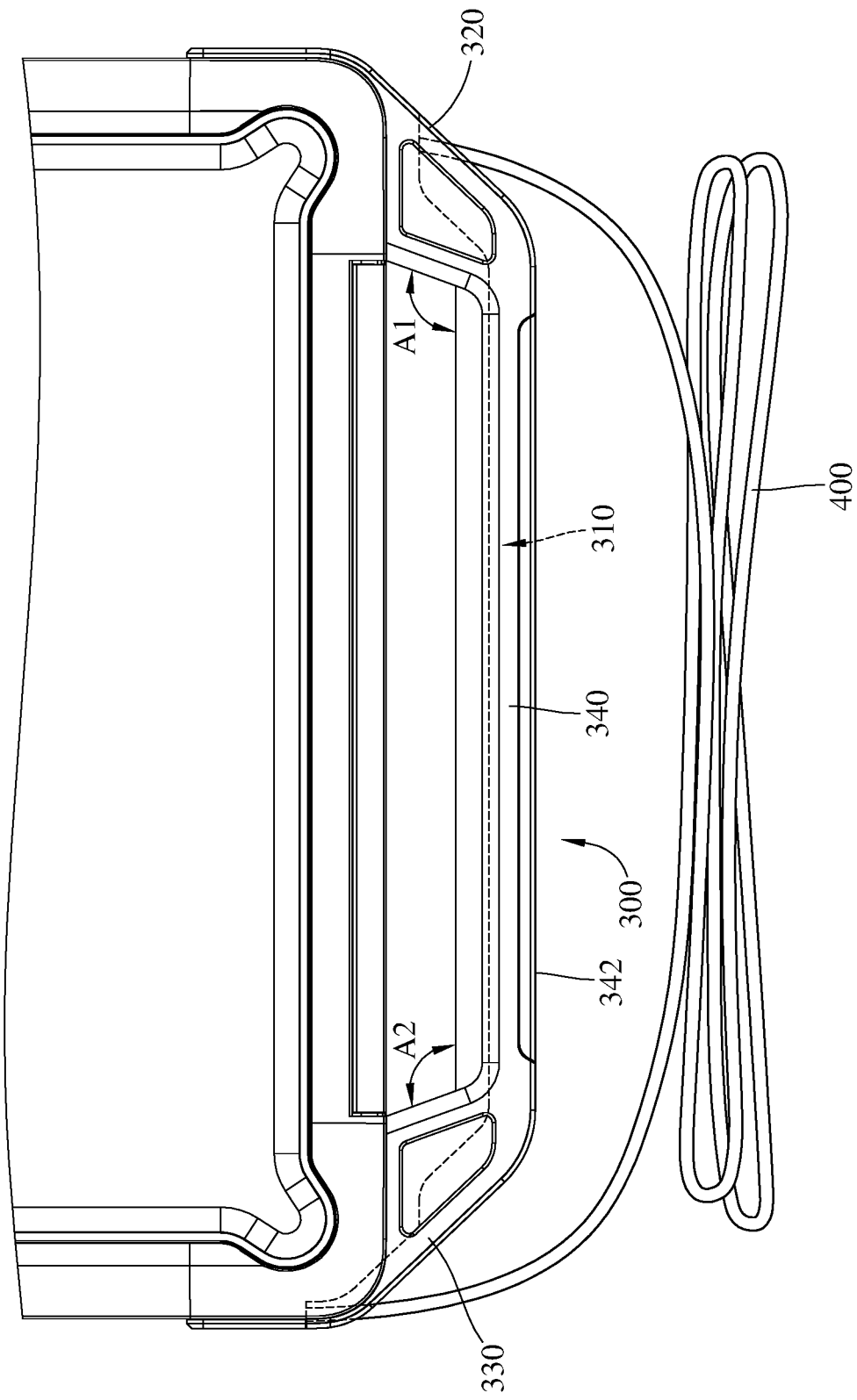
FIG. 2 is a partially enlarged top view of the notebook computer in FIG. 1.

Please refer to FIG. 2, which is a partially enlarged top view of the notebook computer 10 in FIG. 1. In this and some embodiments of the present disclosure, the first part 320 is at a first angle A1 to the arm part 340, the second part 330 is at a second angle A2 to the arm part 340, and the first angle A1 and the second angle A2 are both obtuse. The recess 310 of the handle 300 is continuously formed on the outer surface 342 of the arm part 340, the first part 320, and the second part 330, and the power cable 400 is allowed to be stored in the recess 310. The first angle A1 and the second angle A2 are not restricted to be obtuse; in other embodiments, the first angle or the second angle may be right or acute.

Figure 3:
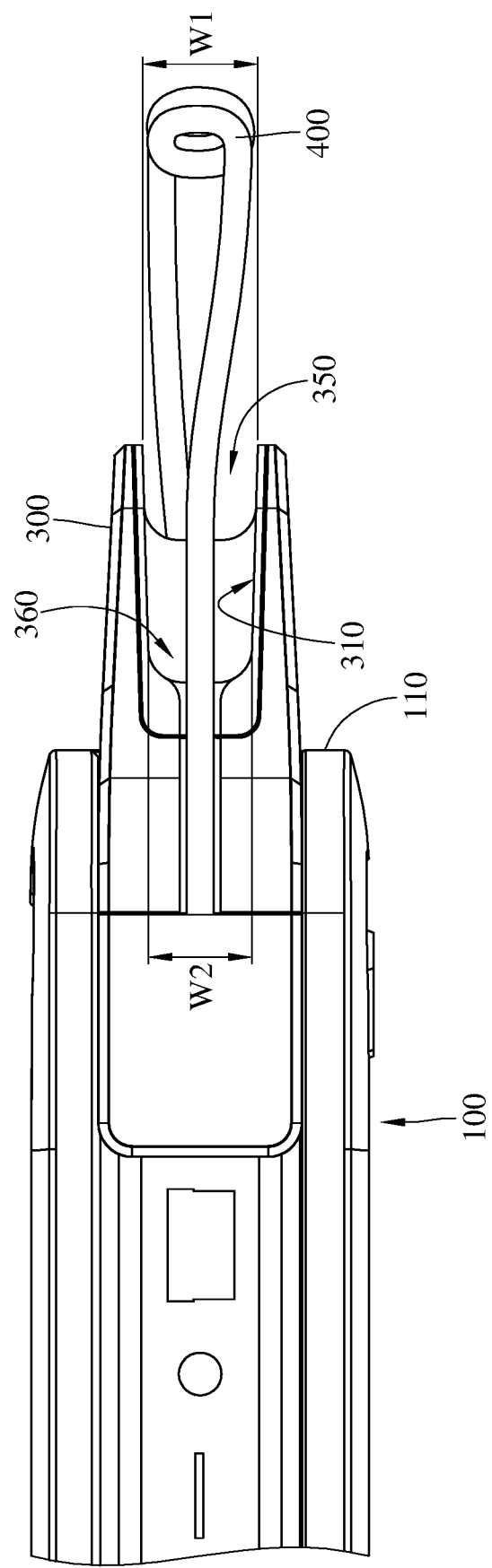
FIG. 3 is a partially enlarged side view of the notebook computer in FIG. 1.

Please refer to FIG. 3, which is a partially enlarged side view of the notebook computer 10 in FIG. 1. In this and some embodiments of the present disclosure, the handle 300 may further have an open side 350 and a closed side 360. The open side 350 and the closed side 360 are respectively located at two opposite sides of the recess 310 of the handle 300 and may be respectively considered to be the opening and the bottom of the recess 310. The open side 350 is located farther away from the first side 110 of the computer host 100 than the closed side 360. A first width W1 of the open side 350 is larger than a second width W2 of the closed side 360. This allows the power cable 400 to be easily put into the recess 310 of the handle 300 and the handle 300 is still sufficiently strong.

Figure 4:
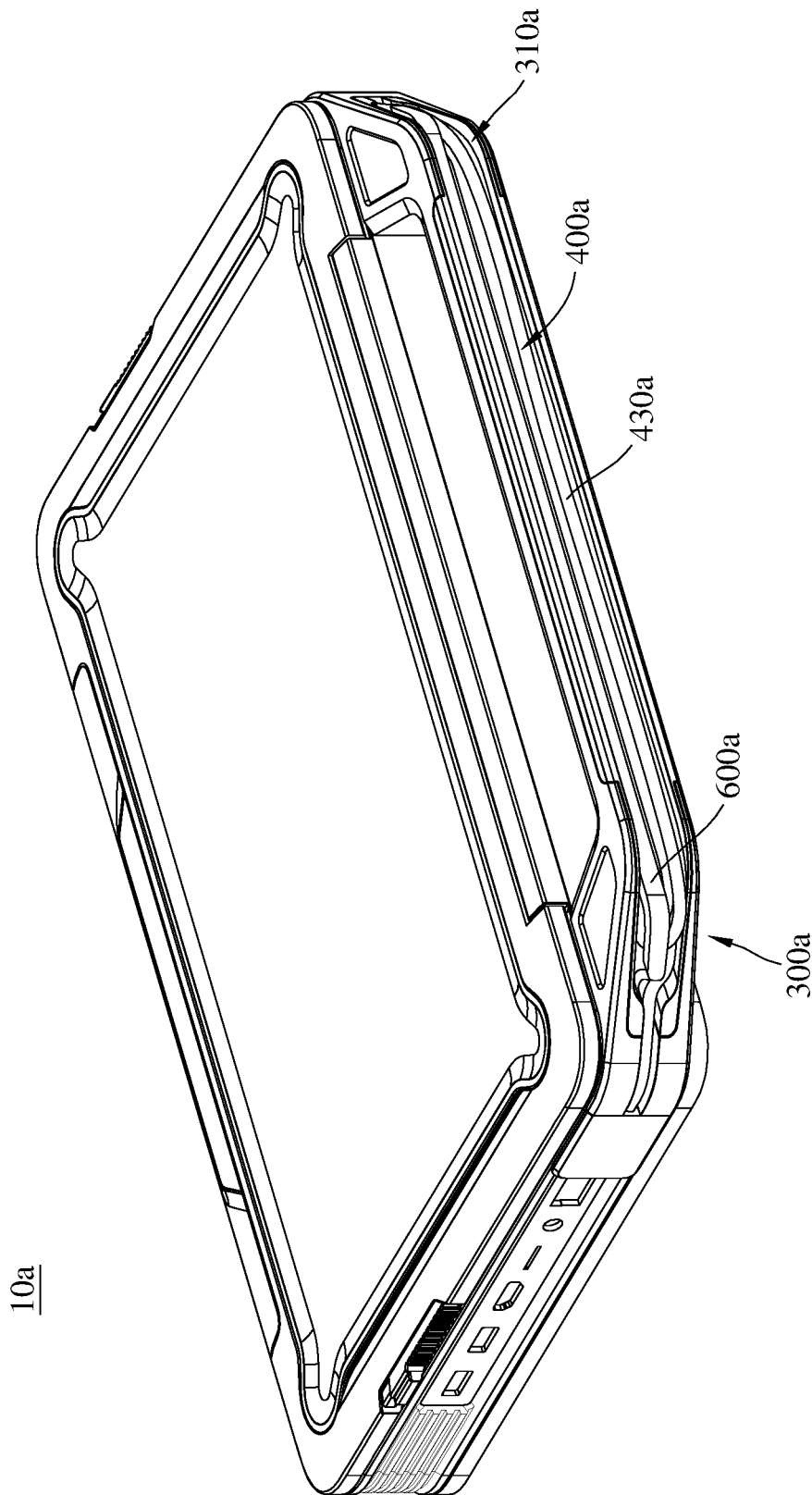
FIG. 4 is a perspective view of a notebook computer according to another embodiment of the present disclosure when a power cable is stored in a handle.

Please refer to FIG. 4, which is a perspective view of a notebook computer 10a according to another embodiment of the present disclosure when a power cable 400a is stored in a handle 300a. It is noted that only the differences from the preceding embodiments are described hereinafter. In this and some embodiments of the present disclosure, the notebook computer 10a may further include a stand 600a located at a recess 310a of the handle 300a. A middle portion 430a of the power cable 400a is able to be wound around the stand 600a, making the power cable 400a easy to be stored in an efficient manner.

Figure 5:
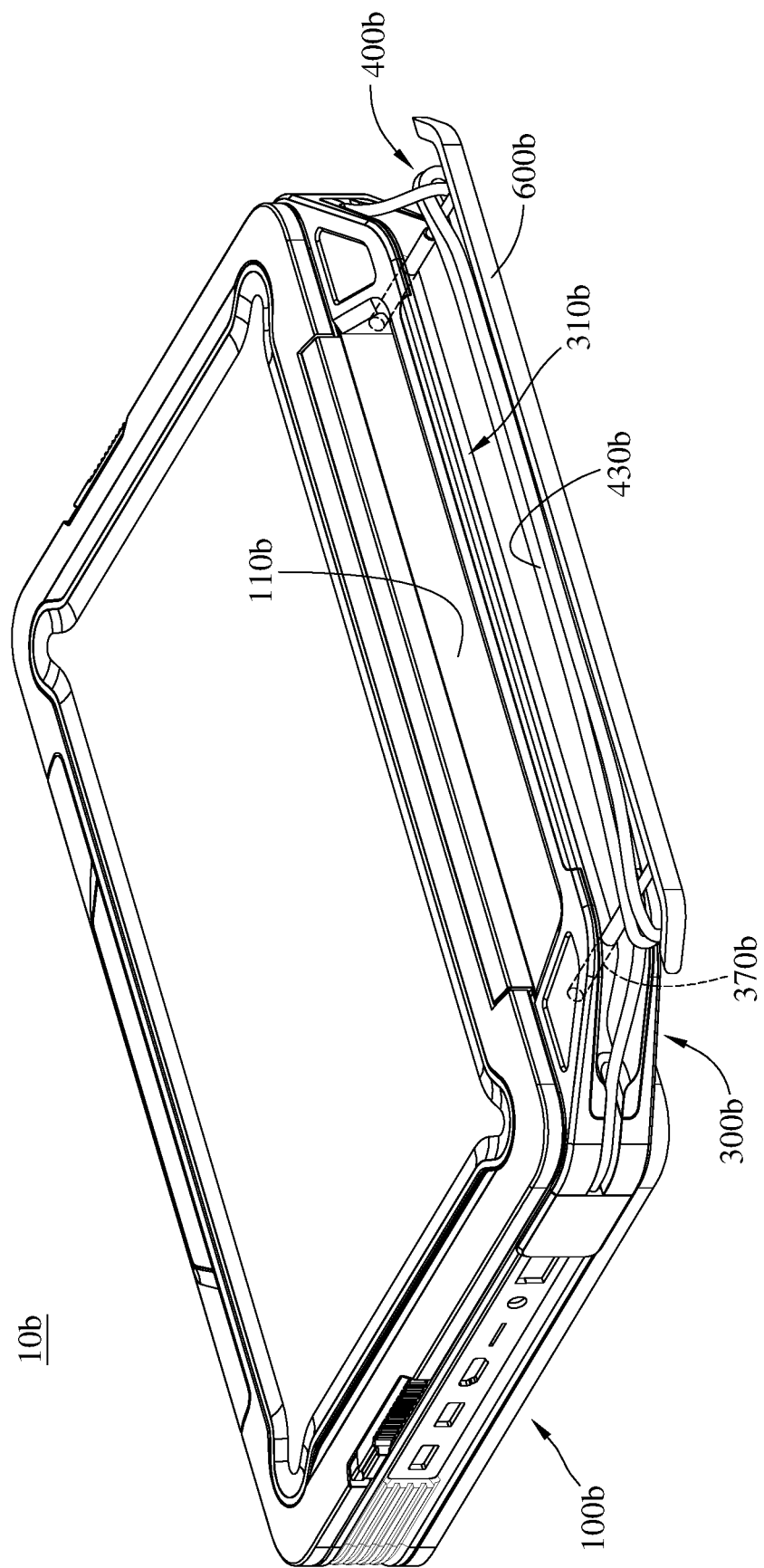
FIG. 5 is a perspective view of a notebook computer according to yet another embodiment of the present disclosure.

Please refer to FIG. 5, which is a perspective view of a notebook computer 10b according to yet another embodiment of the present disclosure. It is noted that only the differences from the preceding embodiments are described hereinafter. In this and some embodiments of the present disclosure, a handle 300b may further has two holes 370b, but the disclosure is not limited thereto. In some embodiments, the amount of the hole may be one or more than two. In this and some embodiments, the holes 370b extend toward a first side 110b of a computer host 100b and connected to a recess 310b of the handle 300b. A stand 600b is slidably disposed at the holes 370b of the handle 300b. Accordingly, the stand 600b can be pulled away from the first side 110b of the computer host 100b, such that a middle portion 430b of a power cable 400b can be wound around the stand 600b without interfering with the handle 300b. After the middle portion 430b of the power cable 400 has been wound in position, the stand 600b can be pushed back in the recess 310b of the handle 300b.

Figure 6:
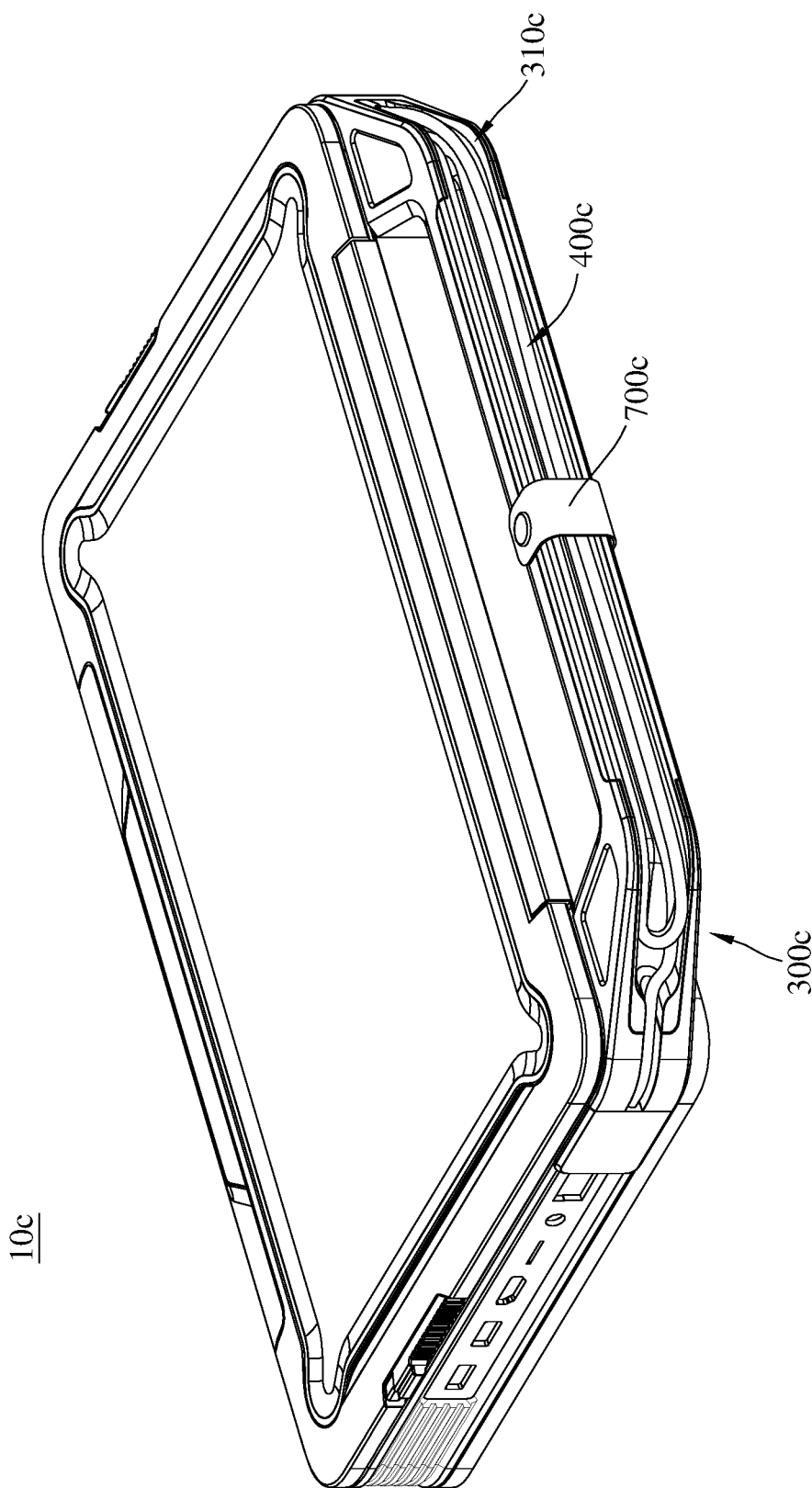
FIG. 6 is a perspective view of a notebook computer according to still another embodiment of the present disclosure.

Please refer to FIG. 6, which is a perspective view of a notebook computer 10c according to still another embodiment of the present disclosure. It is noted that only the differences from the preceding embodiments are described hereinafter. In this and some embodiments of the present disclosure, the notebook computer 10c may further include a fastener 700c. One end of the fastener 700c is fixed on a handle 300c, and another end of the fastener 700c is detachably disposed on the handle 300c. The fastener 700c can prevent a power cable 400c from coming out of a recess 310c of the handle 300c.

Figure 7:
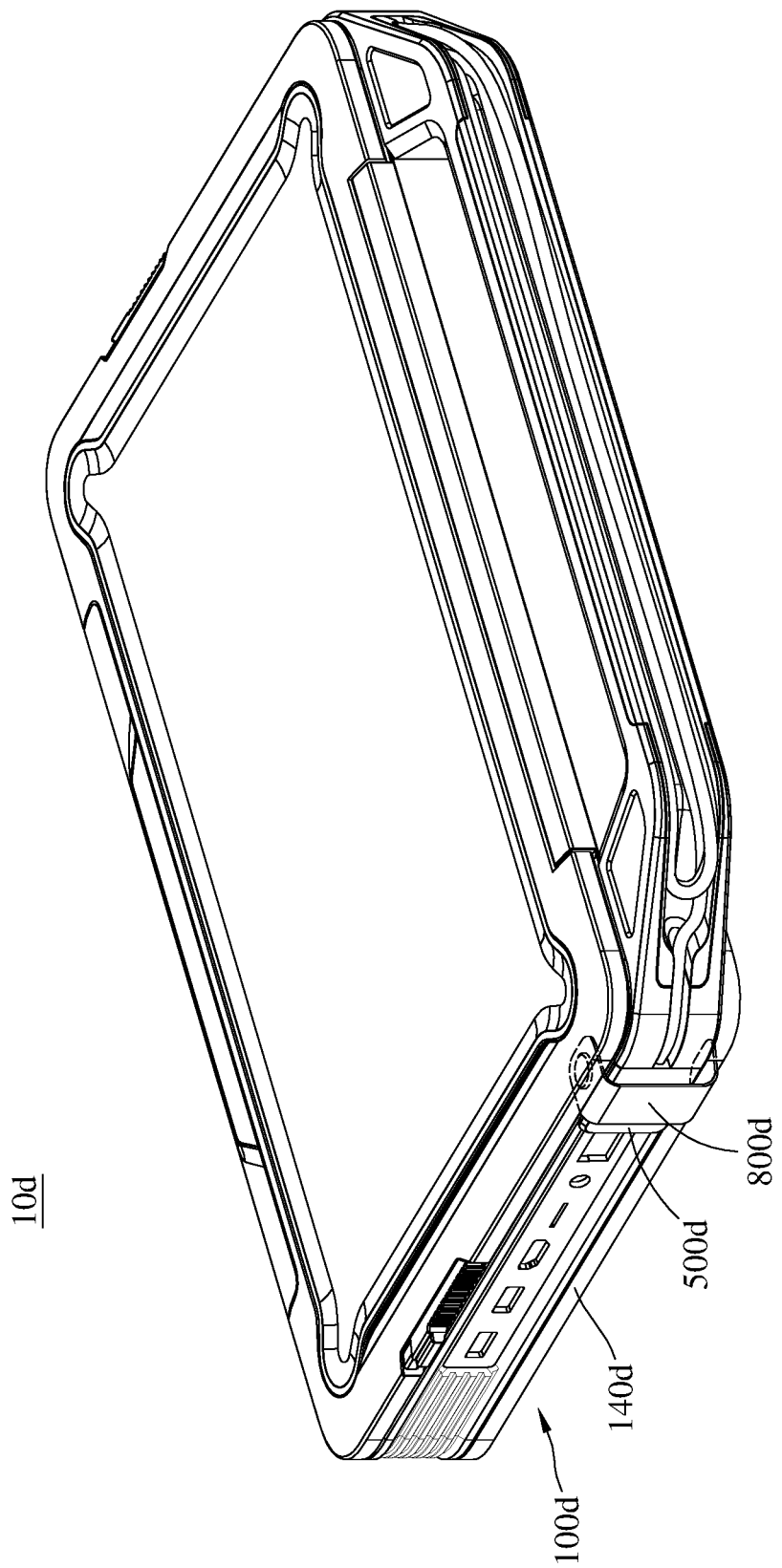
FIG. 7 is a perspective view of a notebook computer according to further another embodiment of the present disclosure.

Please refer to FIG. 7, which is perspective view of a notebook computer 10d according to further another embodiment of the present disclosure. It is noted only the differences from the preceding embodiments are described hereinafter. In this and some embodiments of the present disclosure, the notebook computer 10d may further include a fastener 800d in contact with a plug 500d firmly. One end of the fastener 800d is fixed on a fourth side 140d of a computer host 100d, and another end of the fastener 800d is detachably disposed on the fourth side 140d of the computer host 100d. The fastener 800d can prevent the plug 500d from coming out of the fourth side 140d of the computer host 100d. In some embodiments, the fastener may be slightly spaced apart from the plug so long as the fastener can prevent the plug from coming out of the fourth side of the computer host.

Figure 8:
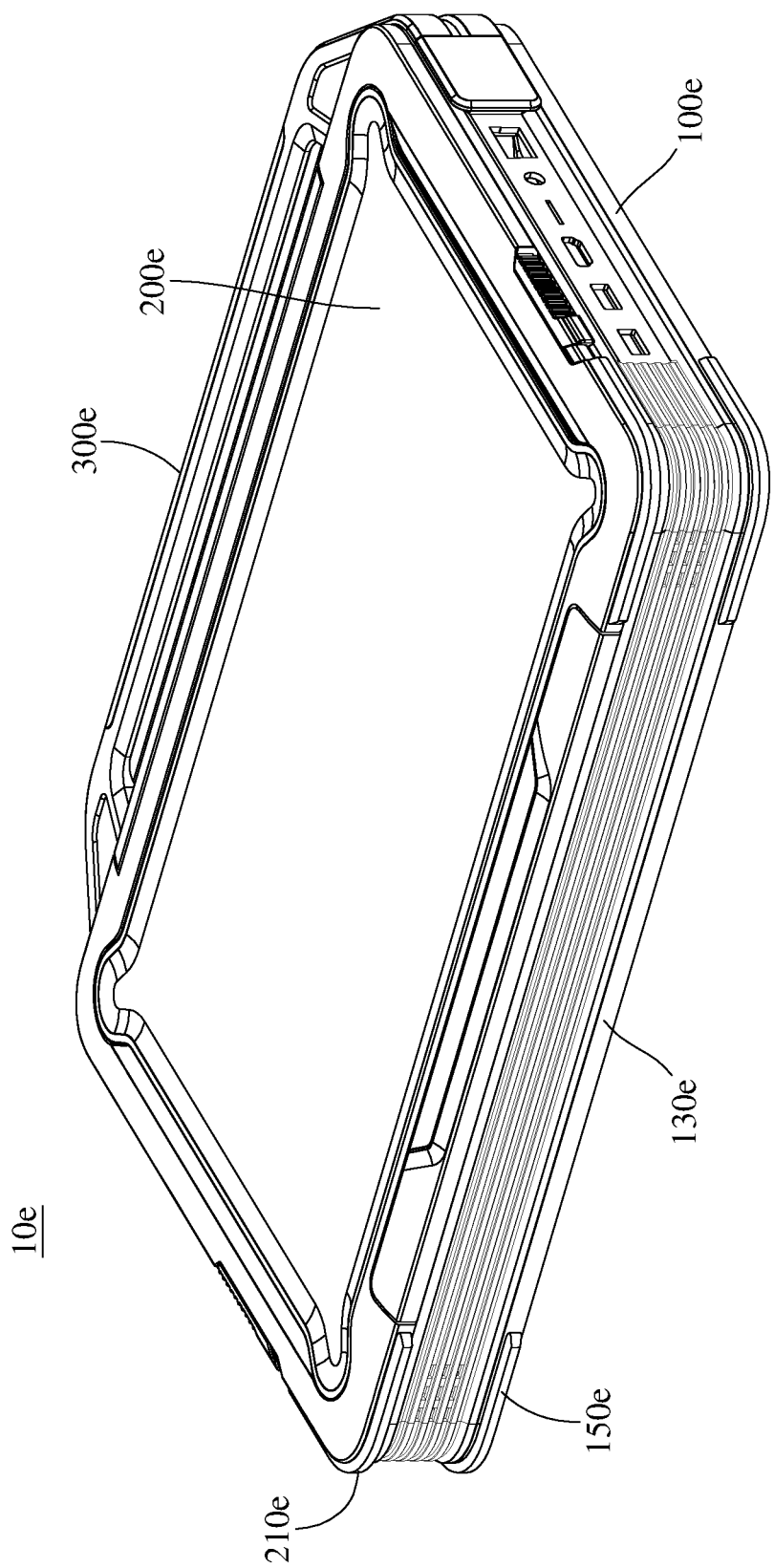
FIG. 8 is a perspective view of a notebook computer according to yet still another embodiment of the present disclosure.

Please refer to FIG. 8, which is a perspective view of a notebook computer 10e according to yet still another embodiment of the present disclosure. It is noted only the differences from the preceding embodiments are described hereinafter. In this and some embodiments of the present disclosure, a computer host 100e may further include a first buffer component 150e located at a side of the computer host 100e away from a handle 300e (i.e., a third side 130e of the computer host 100e). A display device 200e may further include a second buffer component 210e located at a side of the display device 200e away from the handle 300e. The first buffer component 150e and the second buffer component 210e may be made of rubber. When the notebook computer 10e is placed on a platform (e.g., a table) in a way that the third side 130e of the computer host 100e faces the platform, the first buffer component 150e and the second buffer component 210e can absorb an impact from the platform.

Figure 9:
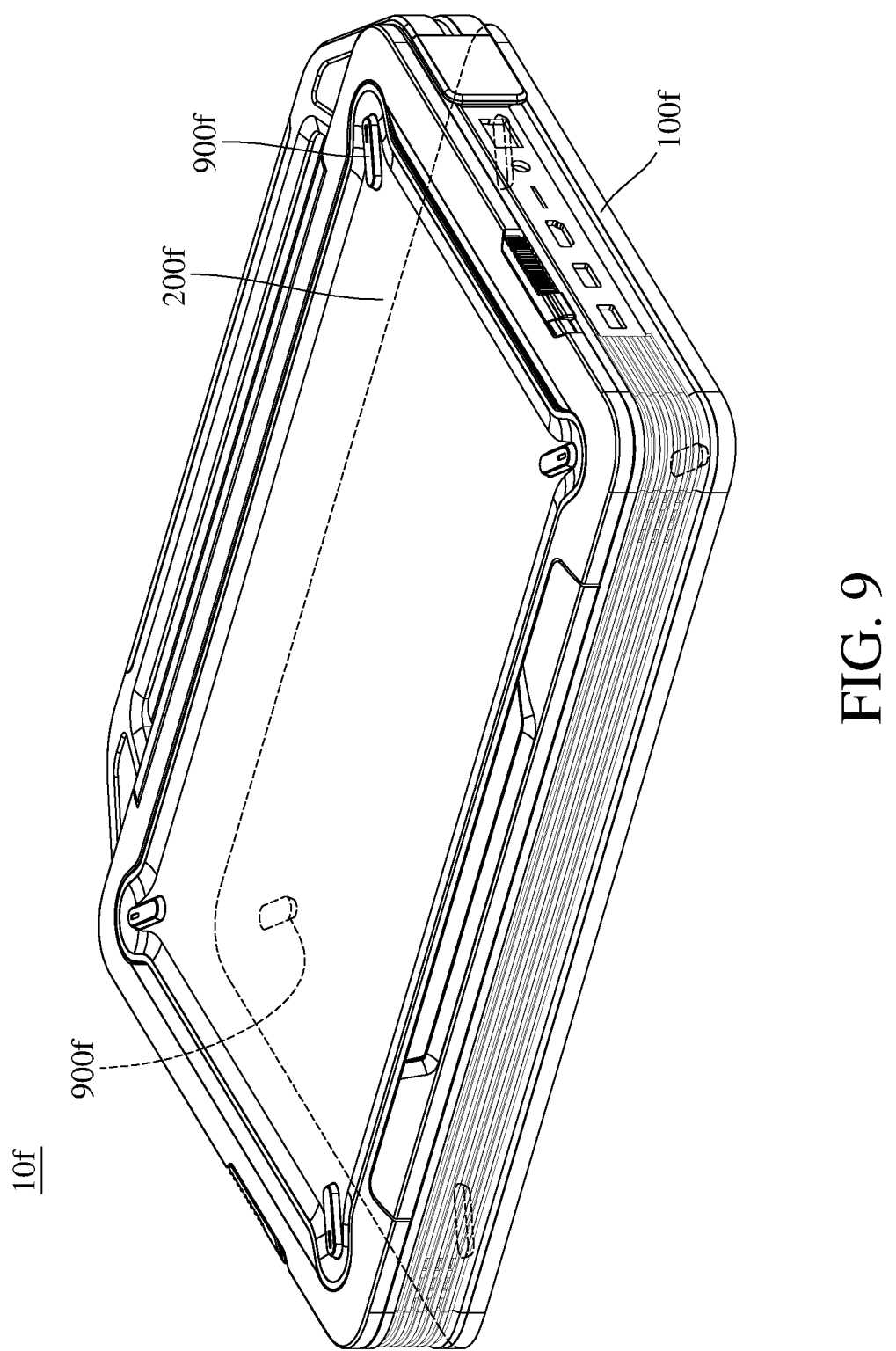
FIG. 9 is a perspective view of a notebook computer according to still further another embodiment of the present disclosure.

Please refer to FIG. 9, which is a perspective view of a notebook computer 10f according to still further another embodiment of the present disclosure. It is noted only the differences from preceding embodiments are described hereinafter. In this and some embodiments of the present disclosure, the notebook computer 10f may further include a plurality of cushions 900f. The amount of the cushions 900f may be eight, but the disclosure is not limited thereto. In some embodiments, the amount of the cushion may be one to seven or more than eight. In this and some embodiments, four of the cushions 900f are disposed at a side of a display device 200f away from a computer host 100f, and the other four of the cushions 900f are disposed at a side of the computer host 100f away from the display device 200f When the notebook computer 10f is placed on the platform in a way that four of the cushions 900f in the same side face the platform, the four of the cushions 900f can absorb an impact from the platform.

Figure 10:
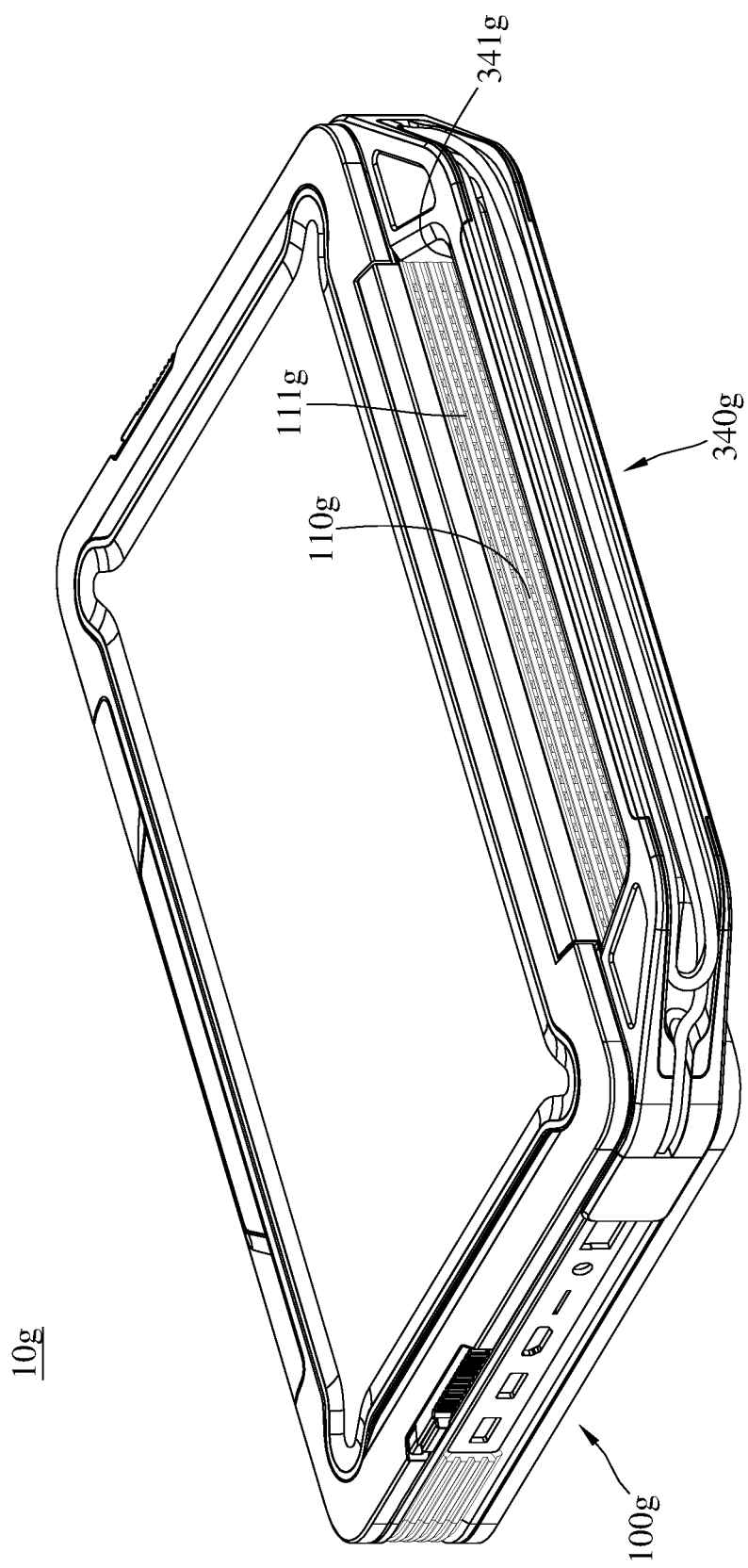
FIG. 10 is a perspective view of a notebook computer according to yet still further another embodiment of the present disclosure.

Please refer to FIG. 10, which is a perspective view of a notebook computer 10g according to yet still further another embodiment of the present disclosure. It is noted only the differences from the preceding embodiments are described hereinafter. In this and some embodiments of the present disclosure, a computer host 100g may further have a plurality of vent holes 111g at a first side 110g. The vent holes 111g face an inner surface 341g of an arm part 340g. During the operation of the notebook computer 10g, the internal heat can be transferred through the vent holes 111g.

According to the notebook computer discussed above, the power cable, the plug and the computer host are connected and would not be stored separately. As such, the user would not forget to bring the power cable and the plug. In addition, the middle portion of the power cable can be stored into the recess of the handle, which is convenient for user while carrying the notebook computer.

In some embodiments, the first part and the second part extend away from the first side of the computer host, and the first part is connected to the second part via the arm part. The arm part is sized to be hand-held, and the user is allowed to carry the notebook computer by holding the arm part.

In some embodiments, the power cable and the plug can be respectively stored in the recess of the handle and the fourth side of the computer host so that the power cable and the plug are assembled to the handle and the computer host, thereby achieving an aesthetic appearance of the notebook computer. The power cable is able to be taken out of the recess of the handle, and the plug is able to be detached from the fourth side of the computer host; and the computer host is able to be electrically connected to an external power source via the power cable and the plug.

In some embodiments, the first angle and the second angle are both obtuse. The recess of the handle is continuously formed on the outer surface of the arm part, the first part and the second part, and the power cable is allowed to be stored in the recess.

In some embodiments, the first width of the open side is larger than the second width of the closed side. This allows the power cable to be easily put into the recess of the handle and the handle is still sufficiently strong.

In some embodiments, the notebook computer may further include a stand. The middle portion of the power cable is able to be wound around the stand, making the power cable easy to be stored in an efficient manner.

In some embodiments, the stand is slidably disposed at the hole of the handle. Accordingly, the stand can be pulled away from the first side of the computer host, such that the middle portion of the power cable can be wound around the stand without interfering with the handle. After the middle portion of the power cable has been wound in position, the stand can be pushed back in the recess of the handle.

In some embodiments, the notebook computer may further include a fastener. The fastener can prevent the power cable from coming out of the recess.

In some embodiments, the notebook computer may further include a fastener. The fastener can prevent the plug from coming out of the fourth side of the computer host.

In some embodiments, the computer host may further include a first buffer component. The display device may further include a second buffer component. When the notebook computer is placed on a platform (e.g., a table) in a way that the third side of the computer host faces the platform, the first buffer component and the second buffer component can absorb an impact from the platform.

In some embodiments, the notebook computer may further include a plurality of cushions. When the notebook computer is placed on the platform in a way that four of the cushions in the same side face the platform, the four of the cushions can absorb an impact from the platform.

In some embodiments, the computer host may further have a plurality of vent holes at the first side. During the operation of the notebook computer, the internal heat can be transferred through the vent holes.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A notebook computer, comprising:
   a computer host;
   a display device, pivotably disposed on the computer host;
   a handle, disposed on the computer host, wherein the handle has a recess;
   a power cable, comprising a base portion, a distal portion and a middle portion, wherein the base portion is connected to the distal portion via the middle portion, the middle portion is connected to the computer host via the base portion, and the middle portion is removably located in the recess of the handle;
   a plug, connected to the distal portion and detachably disposed on the computer host; and
   a stand, located at the recess of the handle, wherein the middle portion of the power cable is able to be wound around the stand.

2. The notebook computer according to claim 1, wherein the computer host further comprises a first side, a second side, a third side and a fourth side, the first side and the third side are located opposite to each other, the second side and the fourth side are located between the first side and the third side and are located opposite to each other, the display device is pivotably disposed at the first side of the computer host, the handle further comprises a first part, a second part and an arm part, the first part is disposed at the second side of the computer host, the second part is disposed at the fourth side of the computer host, the first part and the second part extend away from the first side of the computer host, the first part is connected to the second part via the arm part, the arm part further has an inner surface and an outer surface, the inner surface faces the first side of the computer host, the outer surface is located farther away from the first side of the computer host than the inner surface, the recess of the handle is formed on the outer surface of the arm part, the first part and the second part, the base portion of the power cable is movably connected to the second side of the computer host, the distal portion of the power cable is removably located at the fourth side of the computer host, and the plug is detachably disposed at the fourth side of the computer host.

3. The notebook computer according to claim 2, wherein the first part at a first angle to the arm part, the second part is at a second angle to the arm part, and the first angle and the second angle are obtuse angles.

4. The notebook computer according to claim 1, wherein the handle further has an open side and a closed side, the open side and the closed side are respectively located at two opposite sides of the recess of the handle, the open side is located farther away from the computer host than the closed side, and the open side is wider than the closed side.

5. The notebook computer according to claim 1, wherein the handle further has a hole, the hole extends toward the computer host and is connected to the recess of the handle, and the stand is slidably disposed at the hole of the handle.

6. The notebook computer according to claim 1, further comprising a fastener, wherein an end of the fastener is fixed on the handle, and another end of the fastener is detachably disposed on the handle.

7. The notebook computer according to claim 1, further comprising a fastener, wherein an end of the fastener is fixed on the computer host, and another end of the fastener is detachably disposed on the computer host.

8. The notebook computer according to claim 1, wherein the computer host further comprises a first buffer component located at a side of the computer host away from the handle, and the display device further comprises a second buffer component located at a side of the display device away from the handle.

9. The notebook computer according to claim 1, further comprising a cushion disposed at a side of the display device away from the computer host or a side of the computer host away from the display device.

\* \* \* \* \*